(12) United States Patent
Jiang et al.

(10) Patent No.: US 11,868,046 B2
(45) Date of Patent: Jan. 9, 2024

(54) STABLE SOLUTIONS OF MONOALKYL TIN ALKOXIDES AND THEIR HYDROLYSIS AND CONDENSATION PRODUCTS

(71) Applicant: Inpria Corporation, Corvallis, OR (US)

(72) Inventors: Kai Jiang, Corvallis, OR (US); Stephen T. Meyers, Corvallis, OR (US); Lauren B. McQuade, Albany, OR (US); Jeremy T. Anderson, Corvallis, OR (US); Brian J. Cardineau, Corvallis, OR (US); Benjamin L Clark, Corvallis, OR (US); Dominick Smiddy, Corvallis, OR (US); Margaret Wilson-Moses, Corvallis, OR (US)

(73) Assignee: Inpria Corporation, Corvallis, OR (US)

( * ) Notice: Subject to any disclaimer, the term of this patent is extended or adjusted under 35 U.S.C. 154(b) by 0 days.

(21) Appl. No.: 17/689,135

(22) Filed: Mar. 8, 2022

(65) Prior Publication Data

US 2022/0187705 A1 Jun. 16, 2022

Related U.S. Application Data

(63) Continuation of application No. 16/446,732, filed on Jun. 20, 2019, now Pat. No. 11,300,876.

(60) Provisional application No. 62/688,215, filed on Jun. 21, 2018.

(51) Int. Cl.
*G03F 7/004* (2006.01)
*G03F 7/20* (2006.01)
*G03F 7/16* (2006.01)
*B05D 1/00* (2006.01)

(52) U.S. Cl.
CPC ........... *G03F 7/0043* (2013.01); *B05D 1/005* (2013.01); *G03F 7/168* (2013.01); *G03F 7/20* (2013.01)

(58) Field of Classification Search
CPC . B05D 1/005; G03F 7/16; G03F 7/162; G03F 7/168
See application file for complete search history.

(56) References Cited

U.S. PATENT DOCUMENTS

| | | | |
|---|---|---|---|
| 2,675,399 A | 4/1954 | Ramsden et al. | |
| 2,822,409 A | 2/1958 | Gwynn et al. | |
| 3,398,169 A | 8/1968 | Neumann et al. | |
| 5,395,803 A * | 3/1995 | Adams | G03F 7/162 118/52 |
| 5,980,978 A | 11/1999 | Jones et al. | |
| 6,256,100 B1 * | 7/2001 | Banet | G01B 11/0666 356/630 |
| 6,458,984 B1 | 10/2002 | Baum et al. | |
| 6,517,901 B1 | 2/2003 | Minami et al. | |
| 6,752,872 B2 * | 6/2004 | Inada | B05D 3/0486 118/52 |
| 7,230,680 B2 * | 6/2007 | Fujisawa | H01L 22/12 355/72 |
| 7,321,048 B2 | 1/2008 | Shenai-Khatkhate et al. | |
| 7,842,828 B2 | 11/2010 | Bijanto et al. | |
| 8,198,352 B2 | 6/2012 | Deelman et al. | |
| 8,278,470 B2 | 10/2012 | Yanagihara et al. | |
| 8,633,330 B2 | 1/2014 | Merz et al. | |
| 9,310,684 B2 | 4/2016 | Meyers et al. | |
| 9,482,957 B1 * | 11/2016 | Lin | G03F 7/16 |
| 9,745,450 B2 | 8/2017 | Frenkel et al. | |
| 10,228,618 B2 | 3/2019 | Meyers et al. | |
| 10,900,114 B2 * | 1/2021 | Burgess | H01J 37/3405 |
| 10,975,109 B2 | 4/2021 | Edson et al. | |
| 2004/0211941 A1 | 10/2004 | Miyoshi | |
| 2006/0241004 A1 * | 10/2006 | Somervell | G03F 7/168 510/170 |
| 2008/0269405 A1 | 10/2008 | Okamoto et al. | |
| 2010/0055924 A1 * | 3/2010 | Ganesan | H01L 21/6708 257/E21.228 |
| 2010/0101487 A1 * | 4/2010 | Somervell | G03F 7/168 118/52 |
| 2011/0166268 A1 | 7/2011 | Deelman et al. | |

(Continued)

FOREIGN PATENT DOCUMENTS

DE 3109309 A1 9/1982
EP 2123659 A1 11/2009

(Continued)

OTHER PUBLICATIONS

Hänssgen et al., "Synthesis Of The First Mono-t-butyltin Element Connections", Organometallic Chemistry, 293:191-195 (1985). (Abstract Only).
Jaumier et al., "Transmetalation Of Tetraalkynyltin Compounds With Grignard Reagents: Access to Mono-and Dialkyltin Products", Angewandte Chemie International Edition, 38(3):402-404 (Feb. 1, 1999).
Jaumier et al., "New Route To Monoorganotin Oxides And Alkoxides From Trialkynylorganotins", Chemical Communications, (3):369-370 (1998).

(Continued)

*Primary Examiner* — Amanda C. Walke
(74) *Attorney, Agent, or Firm* — Christensen, Fonder, Dardi PLLC; Diane E. Bennett; Peter S. Dardi

(57) ABSTRACT

Precursor solutions for radiation patternable coatings are formed with an organic solvent and monoalkyl tin trialkoxides in which the water content of the solvent is adjusted to be within 10 percent of a selected value. Generally, the water content of the solvent is adjusted through water addition, although water removal can also be used. In some embodiments, the adjusted water content of the solvent can be from about 250 ppm by weight to about 10,000 ppm by weight. With the appropriate selection of ligands, the adjusted precursor solutions can be stable for at least about 42 days, and in some cases at least 8 months.

18 Claims, No Drawings

(56) References Cited

U.S. PATENT DOCUMENTS

| | | |
|---|---|---|
| 2012/0223418 A1 | 9/2012 | Stowers et al. |
| 2013/0281725 A1 | 10/2013 | Merz, III et al. |
| 2014/0087066 A1 | 3/2014 | Wang et al. |
| 2016/0116839 A1 | 4/2016 | Meyers et al. |
| 2017/0002180 A1 | 1/2017 | Frenkel et al. |
| 2017/0102612 A1* | 4/2017 | Meyers ................ C23C 14/086 |
| 2017/0334935 A1 | 11/2017 | Pieper et al. |
| 2018/0090344 A1* | 3/2018 | Kim .................. H01J 37/32642 |
| 2018/0364568 A1 | 12/2018 | Tsubaki et al. |
| 2019/0315781 A1 | 10/2019 | Edson et al. |
| 2020/0073238 A1 | 3/2020 | Zi et al. |
| 2020/0124970 A1 | 4/2020 | Kocsis et al. |
| 2020/0239498 A1 | 7/2020 | Clark et al. |
| 2020/0241413 A1 | 7/2020 | Clark et al. |
| 2021/0375591 A1* | 12/2021 | Chandrashekar ........................... H01J 37/32715 |

FOREIGN PATENT DOCUMENTS

| | | |
|---|---|---|
| EP | 3435158 A1 | 1/2019 |
| JP | 3800291 B2 * | 7/2006 |
| JP | 2010-094583 A | 4/2010 |
| JP | 2018-502173 A | 1/2018 |
| JP | 2019-500490 A | 1/2019 |
| KR | 10-2016-0132092 A | 11/2016 |
| KR | 10-2018-0054917 A | 5/2018 |
| TW | 2016-31377 A | 9/2016 |
| TW | 2017-34025 A | 10/2017 |
| WO | 2012-099253 A1 | 7/2012 |
| WO | 2017-163922 A1 | 9/2017 |
| WO | 2018-142888 A | 8/2018 |
| WO | 2017-164018 A | 11/2018 |
| WO | 2019-023797 A1 | 2/2019 |

OTHER PUBLICATIONS

Jones et al., "Amino-Derivatives Of Metals And Metalloids. Part I. Preparation Of Aminostannenes, Stannylamines and Stannazanes", Journal of the Chemical Society, 1944-1951 (1965).

Pauli et al., "Importance of Purity Evaluation and the Potential of Quantitative 1H NMR as a Purity Assay" Journal of Medicinal Chemistry (2014) vol. 57, pp. 9220-9231.

Puff et al., "Zur Hydrolyse von Monoorganylzinn-trihalogeniden", Journal of Organometallic Chemistry, 368:173-183 (1989).

Weber et al., "Method development in quantitative NMR towards metrologically traceable organic certified reference materials used as 31P qNMR standards", Anal Bioanal Chem (2015), 407:3115-3126.

Williams et al., "Drying of Organic Solvents: Quantitative Evaluation of the Efficiency of Several Desiccants," J. Organic Chemistry 2010, 75 (24), 8351-8354. (Abstract Only).

International Search Report and Written Opinion For International Application No. PCT/US2019/037972 dated Oct. 18, 2019.

Office Action from corresponding Taiwan Patent Application No. 108121294 dated May 13, 2021.

Office Action from corresponding Korean Patent Application No. 10-2020-7034527 dated May 19, 2022.

\* cited by examiner

US 11,868,046 B2

STABLE SOLUTIONS OF MONOALKYL TIN ALKOXIDES AND THEIR HYDROLYSIS AND CONDENSATION PRODUCTS

CROSS REFERENCE RELATED TO APPLICATIONS

This application is a continuation of copending U.S. patent application 16/446,732 filed on Jun. 20, 2019 to Jiang et al., entitled "Stable Solutions Of Monoalkyl Tin Alkoxides And Their Hydrolysis And Condensation Products," which claims priority to corresponding U.S. provisional patent application 62/688,215 filed on Jun. 21, 2018 to Jiang et al., entitled "Stable Solutions Of Monoalkyl Tin Alkoxides And Their Hydrolysis And Condensation Products," both of which are incorporated herein by reference.

FILED OF THE INVENTION

This invention relates to stable solutions of monoalkyl tin alkoxides and their hydrolysis and condensation products and particularly to the compositions of stable solutions and the methods to make them.

BACKGROUND OF THE INVENTION

Organometallic photoresists, particularly monoalkyltin compositions, are high performance materials that are capable of producing very high resolution structures when patterned lithographically. In addition to their high lithographic performance, high volume semiconductor manufacturing processes that use these materials also pose practical process requirements in order to provide for effective use of these promising materials. To provide for effective commercialization of these materials, it is useful to identify and resolve appropriate obstacles.

SUMMARY OF THE INVENTION

In a first aspect, the invention pertains to a method for preparing an adjusted precursor solution for a radiation patternable coating comprising a mixture of an organic solvent and a first monoalkyl tin trialkoxide ($RSn(OR')_3$) having a tin concentration that is from about 0.004 M to about 1.0 M. The method generally comprises the step of mixing the organic solvent and the first monoalkyl tin trialkoxide to form the adjusted precursor solution, in which the solvent has been adjusted to have a water content to within ±15 percent of a selected value and wherein the adjusted water content is no more than 10,000 ppm by weight. In some embodiments, the adjusted precursor solution is stable for at least 42 days.

In a further aspect, the invention pertains to a solution comprising a mixture of alcohol with a selected water content and a first monoalkyl tin trialkoxide ($RSn(OR')_3$), wherein the solution has a tin concentration from about 0.004M to about 1.0 M, wherein the selected water content is at least about 250 pm by weight and wherein the solution is stable for at least 42 days.

In an additional aspect, the invention pertains to a method for patterning a radiation sensitive coating. The method generally comprises the steps of:

forming a coating on a substrate surface with a precursor solution wherein the precursor solution has a uniform composition resulting from adjusting the water content of the solvent used to form the adjusted precursor solution within about ±15% of a target value, wherein the selected water content is from about 300 ppm by weight to about 10,000 ppm by weight;

drying the coating; and irradiating the dried coating to form a latent image.

DETAILED DESCRIPTION OF THE INVENTION

Stable solutions of monoalkyl tin trialkoxides are formed through the control of the water content of the solvents, especially alcohol solvents, used to form the solutions. Under some storage conditions, monoalkyl tin alkoxides and monoalkyl tin hydrolysates can form precipitates when stored for a period of time. Exposure to moisture and air may hasten the formation of these precipitates as the alkoxides hydrolyze and condense to insoluble species. Monoalkyl tin trialkoxides have been established as effective precursors for radiation-sensitive coatings that enable patterning of fine features via, for example, extreme ultraviolet (EUV) lithography. It is generally desirable for organotin compositions to possess sufficient stability, such as in regards to shelf life and performance consistency, for extended periods of time. As described herein, the stability of these precursor coating materials can be effectively enhanced through the selection of the alkyl ligands and/or through the control of the water content of the solution. Along with establishing the stability of the solutions, the stabilized monoalkyl tin trialkoxide solutions are expected to provide reliable reproducibility of coating processing and patterning results. Commercially suitable coating solutions having an appropriate shelf life and desired reproducibility can thus be formed.

The use of alkyl metal coordination compounds in high performance radiation-based patterning compositions is described, for example, in U.S. Pat. No. 9,310,684 to Meyers et al. (hereinafter the '684 patent), entitled "Organometallic Solution Based High Resolution Patterning Compositions," incorporated herein by reference. Refinements of these organometallic compositions for patterning are described in published U.S. patent application 2016/0116839 A1 to Meyers et al., entitled "Organometallic Solution Based High Resolution Patterning Compositions and Corresponding Methods" and U.S. Pat. No. 10,228,618 A1 to Meyers et al. (hereinafter the '618 patent), entitled "Organotin Oxide Hydroxide Patterning Compositions, Precursors, and Patterning" and copending U.S. patent application Ser. No. 15/950,286 to Edson et al. (hereinafter the '286 application), entitled "Monoalkyl Tin Compositions with Low Polyalkyl Contamination, Their Compositions and Methods," each of which is incorporated herein by reference.

In general, these alkyl metal compounds are susceptible to gelation and precipitation from solution. For example, hydrolysis of alkoxy ligands can result in a complex distribution of corresponding products and can add to instability. The '618 patent describes alkyl tin precursor solutions that are stable for one to four weeks. These solutions were prepared by dissolution of hydrolyzed and condensed products of $RSnX_3$ in an organic solvent, wherein R=alkyl group and Sn—X readily hydrolyzes in an aqueous solution. The '684 patent describes monoalkyl tin oxohydroxo compositions that can be stable for some weeks. Stability can be evaluated with respect to the amount of time before the observation of visible solids precipitating from solution. As shown in the Examples below, the compositions formulated herein can be stable for surprising amounts of time even with some water present. Inventors have found that solutions comprising an alcohol, small amounts of water, and a monoalkyl tin alkoxides, which in some embodiments are mixtures of different alkyl groups, can be prepared. These combinations improve solution stability to times exceeding 6 months, which is a longer period when compared with previously known monoalkyl tin solutions exposed to air and water vapor. In some embodiments, solutions are stable for longer than one year.

The use of organometallic tin compositions as radiation resists for patterning, especially for EUV lithography patterning, is generally based on monoalkyl tin oxo hydroxo compounds. The oxo hydroxo compounds can be made in solution, or they can be made during and/or subsequent to an in situ coating process involving water based hydrolysis of $RSnX_3$ compounds in which R is an alkyl group and Sn—X is a hydrolysable group, for example an alkoxide group. The discussion herein focuses on precursor compositions used for forming alkyl tin oxo-hydroxo compositions that are advantageous for high resolution patterning.

In general, the alkyl tin precursor compositions comprise a group that can be hydrolyzed with water or other suitable reagent under appropriate conditions to form the alkyl tin oxo-hydroxo patterning compositions, which can be represented by the formula $RSnO_{(1.5-(x/2))}(OH)_x$ where $0<x\leq3$. The hydrolysis and condensation reactions that can transform the compositions with hydrolyzable Sn—X groups are indicated in the following reactions:

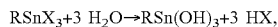

$RSnX_3+3\ H_2O \rightarrow RSn(OH)_3+3\ HX$,

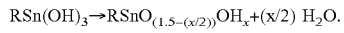

$RSn(OH)_3 \rightarrow RSnO_{(1.5-(x/2))}OH_x+(x/2)\ H_2O$.

Monoalkyl tin trialkoxides are suitable precursor compounds for forming the monoalkyl tin oxo hydroxo compounds, and monoalkyl tin triamides are suitable precursors for forming monoalkyl tin trialkoxides. Current best practices for using these resist compositions comprise forming a coating of monoalkyl tin trialkoxide, and hydrolyzing the trialkoxide in situ to form the oxo hydroxo compositions with a volatile alcohol by product that readily evaporates. The solutions described herein are stable monoalkyl tin trialkoxide solutions that can be effectively used commercially to form coatings that are hydrolyzed, during processing and/or in situ in the coatings, to form monoalkyl tin oxide hydroxide compounds for high performance patterning.

The alkyl tin trialkoxide compositions can be represented by the formula $RSn(OR')_3$, where R and R' are independently hydrocarbyl groups, such as an alkyl or a cycloalkyl with 1-31 carbon atoms with one or more carbon atoms optionally substituted with one of more heteroatom functional groups containing O, N, Si, Ge, Sn, Te, and/or halogen atoms or an alkyl or a cycloalkyl further functionalized with a phenyl or cyano group. In some embodiments, R' can comprise ≤10 carbon atoms and can be, for example, methyl, ethyl, propyl, isopropyl, butyl, t-butyl, isobutyl, or t-amyl. The R group can be a linear, branched, (i.e., secondary or tertiary at the metal-bonded carbon atom), or cyclic hydrocarbyl group. Each R group individually and generally has from 1 to 31 carbon atoms with 3 to 31 carbon atoms for the group with a secondary-bonded carbon atom and 4 to 31 carbon atoms for the group with a tertiary-bonded carbon atom. In particular, branched alkyl ligands can be desirable for some patterning compositions where the compound can be represented as $R^1R^2R^3CSn(OR')_3$, where $R^1$ and $R^2$ are independently an alkyl group with 1-10 carbon atoms, and $R^3$ is hydrogen or an alkyl group with 1-10 carbon atoms. In some embodiments $R^1$ and $R^2$ can form a cyclic alkyl moiety, and $R^3$ may also join the other groups in a cyclic moiety. Suitable branched alkyl ligands can be, for example, isopropyl ($R^1$ and $R^2$ are methyl and $R^3$ is hydrogen), tert-butyl ($R^1$, $R^2$ and $R^3$ are methyl), tert-amyl ($R^1$ and $R^2$ are methyl and $R^3$ is —$CH_2CH_3$), sec-butyl ($R^1$ is methyl, $R^2$ is —$CH_2CH_3$, and $R^3$ is hydrogen), neopentyl ($R^1$ and $R^2$ are hydrogen, and $R^3$ is —$C(CH_3)_3$), cyclohexyl, cyclopentyl, cyclobutyl, and cyclopropyl. Examples of suitable cyclic groups include, for example, 1-adamantyl (—$C(CH_2)_3$ $(CH)_3(CH_2)_3$ or tricyclo(3.3.1.13,7) decane bonded to the metal at a tertiary carbon) and 2-adamantyl (—$CH(CH)_2$ $(CH_2)_4(CH)_2(CH_2)$ or tricyclo(3.3.1.13,7) decane bonded to the metal at a secondary carbon). In other embodiments hydrocarbyl groups may include aryl or alkenyl groups, for example, benzyl or allyl, or alkynyl groups. In other embodiments the hydrocarbyl ligand R may include any group consisting solely of C and H and containing 1-31 carbon atoms. In summary, some examples of suitable alkyl groups bonded to tin include, for example, linear or branched alkyl (i-Pr (($CH_3)_2CH$—), t-Bu (($CH_3)_3C$—), Me ($CH_3$—), n-Bu ($CH_3CH_2CH_2CH_2$—)), cyclo-alkyl (cyclo-propyl, cyclo-butyl, cyclo-pentyl), olefinic (alkenyl, aryl, allylic), or alkynyl groups, or combinations thereof. In further embodiments suitable R groups may include hydrocarbyl groups substituted with hetero-atom functional groups including cyano, thio, silyl, ether, keto, ester, or halogenated groups or combinations thereof.

The alkyl tin trialkoxide precursors can be synthesized from corresponding alkyl tin triamide, although other synthesis pathways can be used, such as those described in the '286 application wherein synthesis of monoalkyl tin trialkoxides is achieved from alkyl triamido tin compositions or by the reaction of alkyl tin trichloride compounds with alcohols as described in the '618 patent for the formation of methyl tin (Ot-butyl)$_3$. The alkyl triamido tin compositions can be represented by the formula $RSn(NR"COR''')_3$. The R groups in the formulas for the alkyl tin triamido tin compositions can be the same R groups as summarized above for the alkyl tin trialkoxide compositions, and the corresponding discussion of these R groups above is as if copied in this paragraph in its entirety. The monoalkyl triamido tin compositions are not discussed further herein. Improved methods for the synthesis of monoalkyl tin trialkoxide compounds from monoalkyl tin triamide compounds are described in the '286 application cited above.

A monoalkyl tin triamide, suitable for synthesizing a corresponding alkyl tin trialkoxide, can be synthesized using the synthesis pathways of the '286 application, which generally involve the substitution of an alkyl ligand in a tin tetraamido compound. After purification, the monoalkyl tin triamides are reacted with a suitable alcohol to replace the alkoxide ligands for the amido ligands. For the reaction of the triamide to form monoalkyl tin trialkoxide, the alcohol can be provided roughly in a stoichiometric amount. Since the alcohol is used to replace three amide groups, three mole equivalents of alcohol would be a stoichiometric amount. In general, the amount of alcohol can be at least about −5% stoichiometric equivalents and in further embodiments at least about a stoichiometric equivalent, or a large excess of alcohol can be used. To facilitate purification of the product alkyl tin trialkoxide, a tetradentate coordination ligand or chelating agent can be added to coordinate with unreacted species to form complexes that do not vaporize during distillation. For example, tris(2-aminoethyl)amine (TREN), triethylenetetraamine (trien), or other tetradentate non-planar chelating agent can be used to complex with the unreacted species to facilitate purification. The chelating agent can be added at a selected time from the start of the reaction to any time prior to performing the distillation, in an amount from about 0.5 mole % to about 15 mole % and in further embodiments from about 1.0 mole % to about 10 mole % relative to the tin molar quantity. A person of ordinary skill in the art will recognize that additional ranges of reactant amounts within the explicit ranges above are contemplated and are within the present disclosure. If desired, a fractional distillation can be performed to further purify the monoalkyl tin trialkoxides from polyalkyl contaminants.

The monoalkyl tin trialkoxides have two adjustable features, the alkyl ligand and the alkoxide ligand. In addition to the requirement for the alkoxide ligand to be ultimately hydrolyzed off during coating formation and/or prior to irradiation for pattern formation, the selection of alkoxide ligands can be driven by other considerations, such as process convenience and precursor properties, for example, melting point. The hydrolyzed alkoxide ligands form alcohols, and these alcohols preferably should have appropriate vapor pressures and low boiling points for ready removal following hydrolysis to form the patternable coating.

As presented in the Examples below, the compositions described herein have been found to be stable for well over 6 weeks, which suggests significantly longer-term stability. Some compositions have been stable for over 8 months. These particularly stable compositions are based on monoalkyl tin tri(O-t-amyl) compounds. The alkoxy ligand O-t-amyl represents O—$CCH_3CH_3CH_2CH_3$. While other alkoxides can be used to practice the current invention, the monoalkyl tin t-amyl alkoxide compounds have been found to possess desirable properties with respect to preparation, purification, and subsequent manipulation and handling. Solutions with blends of compounds having different alkoxy ligands can also be used. Selection of appropriate alkoxy ligands may also be solvent dependent, though it would be expected that other alkoxy ligands should be able to yield at least comparable results.

The monoalkyl ligand remains bound to the tin atom in the radiation patternable coating. The monoalkyl ligand is significant for patterning performance of the ultimate coating, and the fragmenting of the alkyl ligand bond by the radiation is believed to provide the basis for the patterning process and the high contrast of properties between the irradiated and non-irradiated portions of the coating.. It has been discovered that branched alkyl ligands with secondary or tertiary carbons bound to the tin provide desirable radiation patterning with EUV light. But the best patterning results to date have been obtained with blends of two or more alkyl ligands with at least one of the alkyl ligands being bound at a secondary or tertiary carbon. As exemplified below, the alkyl ligands also influence solution stability. Selection of the alkyl ligand composition of the solution therefore involves balancing the patterning performance and the solution stability. Thus, while iso-propyl tin tri-tert-amyloxide may provide the best solution stability, it may not provide the best patterning performance for a particular patterning application. So it is generally desirable to explore the various alkyl ligands and blends thereof to obtain a range of suitably stable solutions while providing desirable patterning performance.

Suitable solvents generally comprise alcohols that are liquids at room temperature. Generally, the solvents are at least 50 weight percent alcohols with any remaining organic solvent liquids being soluble in the alcohol, such as an alkane (such as pentane or hexane), an aromatic hydrocarbon (such as toluene), ether (such as diethyl ether, $C_2H_5OC_2H_5$), or mixtures thereof. In some embodiments, the solvent is at least 90 weight percent alcohol, and the solvent can be effectively alcohol with just trace impurities of other compounds. Suitable alcohols are generally monomeric alcohols with a melting point of no more than about 10° C., such as methanol, ethanol, propanol, butanol, pentanol, hexanol, heptanol, octanol, nonanol, decanol, branched versions thereof, and mixtures thereof. For alcohols with three or more carbon atoms, a large number of branched isomers are available. The examples are based on a branched hexanol, specifically 4-methyl-2-pentanol, which can also be referred to as methyl isobutyl carbinol. Similar results are expected with other alcohols, and the results are not believed to be particularly alcohol dependent, although the specific stabilization may have some quantitative dependence on the alcohol, which can be checked empirically based on the teachings herein.

The resist precursor composition can be conveniently specified based on tin ion molar concentration. In general, the resist precursor solution generally comprises from about 0.0025 M to about 1 M tin cation, in some embodiments from about 0.004M to about 0.9M, in further embodiments from about 0.005 M to about 0.75 M, also in some embodiments from about 0.01M to about 1M, and in additional embodiments from about 0.01 M to about 0.5 M tin cation. A person of ordinary skill in the art will recognize that additional concentration ranges and values within the explicit ranges above are contemplated and are within the present disclosure.

The monoalkyl tin trialkoxides are generally liquid compositions at room temperature that are prepared initially in appropriately purified form. For use, these liquids are dissolved in a suitable solvent. Alcohol solvents have been found to be effective solvents for forming coatings as well as for forming stable solutions with commercially reasonable shelf lives. The improved solutions described herein has adjusted water levels to provide for uniform products for commercial use. Of course, since the compounds are water sensitive, the adjustment of water levels provides various ramifications that are also related to solution stability.

For preparation of the uniform solutions, water content is generally determined in the solvent prior to mixing with the tin composition. Once the mixtures are formed, water may react with the tin compounds, which may complicate water content evaluation. In addition, the alkoxy groups associated with an alcohol solvent may also exchange to some degree with the alkoxy groups of the tin compounds. In general, the amount of water added in the relevant solutions is significantly less than needed to fully hydrolyze the monoalkyl tin trialkoxide compounds. As long as the resulting solution is stable, there would seem to be no harm in partially hydrolyzing the tin compounds, and it is possible that it would be beneficial for processing into the coating for radiation patterning. In any case, these tin compounds can be prone to cluster formation, such as trimers and dodecamers, and the alcohol solutions are known to be complex generally. The presence of some water can be anticipated to further exacerbate the complexity of the compositions in solution, and some observations of the resulting complexities have been evaluated. As used herein and as generally understood in the art, the reference to the solution of the organometallic compounds is understood to refer to the corresponding solution made with the indicated compounds regardless of their particular form following formation of the solution.

With respect to adjustment of water levels in the solvent, a starting point would be evaluation of the water content of the initial organic, e.g., alcohol, solvent. A suitable aliquot of the solvent can be sampled from a stock solution of solvent. While in principle various methods can be used to evaluate the water content of the sample, Karl Fischer titration is an effective and practical approach. Karl Fischer titrators are commercially available for fast and automated evaluation. A Karl Fischer titrators are available from Mettler-Toledo LLC (OH, USA), Metrohm AG (Switzerland) and CSC Scientific Company (VA, USA). The measured initial water content can be used to adjust the water content of the stock solvent prior to formation of the organometallic solution.

Commercial stock solvents even sold at high purity levels have been found to have significantly varying water contents. Examples of measured water contents are presented in the Examples below. Therefore, to obtain a target water content value, the water content of the solvent can be appropriately adjusted.

With respect to efforts to provide for uniform water contents of the solvent, one option would be the removal of water to some uniform value. Water can be removed, for example, through the use of desiccants, such as sodium benzophenone, and molecular sieve based desiccants, such as zeolites, are believed to be particularly effective. See, for example, Williams et al., "Drying of Organic Solvents: Quantitative Evaluation of the Efficiency of Several Desiccants," J. Organic Chemistry 2010, 75 (24), 8351-8354, incorporated herein by reference. Obtaining extremely low concentrations of water can be an expensive and time consuming process relative to adjusting the water content to a set value through addition of water. Also, since alcohol solvents are hydroscopic, particularly strong efforts would also then be needed to prevent any access to water from the ambient environment. Furthermore, since the monoalkyl tin trialkoxide compositions are generally ultimately hydrolyzed, such as through the addition of water, it would seem particularly wasteful to spend effort and expense to exclude water if not necessary. As discovered herein, small amounts of water can be added to achieve uniformity of the solutions without sacrificing stability to appropriate levels, and the remaining discussion focuses on this approach to water content adjustment.

Thus, generally, a batch of stock solvent is obtained, and an aliquot of the batch is checked for water content. As a general matter, a selected concentration of water would be selected to exceed the range of water concentrations of the solvent grade being used so that adjustment of the water content can be adjusted through water addition. However, such a selected water content should be selected to also provide desired shelf life for the precursor solution, which depends on the composition of the monoalkyl tin trialkoxide. Generally, the amount of water selected can also depend on the concentration of tin in the precursor solution.

Adjustment of a solvent's water level can be achieved through the addition of a targeted amount of purified water to the solvent to achieve a desired water level. Alternatively, adjustment of a solvent's water level can be achieved by diluting a portion of solvent having a given water content into a second portion of solvent having a water level different than the first. For example, a solvent having a relatively high water content can be diluted into a solvent having a lower water content to achieve a solvent having a desired water content, which can be more convenient from a process perspective to achieve the equivalent result.

Stability of the precursor solutions can be evaluated with respect to changes relative to the initial solution. Specifically, a solution, as evaluated in an unstirred resting solution, can be described herein to have lost stability if phase separation occurs with the production of large sol particles or if the solution visible particulates are formed. Based on the processing approaches described herein, the solutions can be stable for at least about 42 days without additional mixing, in further embodiments at least about three months, and in other embodiments at least about six months. A person of ordinary skill in the art will recognize that additional ranges of stabilization times are contemplated and are within the present disclosure. Suitable solutions generally can be formulated with sufficient stabilization times that the solutions can be commercially distributed with appropriate shelf lives.

In some embodiments, the selected water content can be set to a selected value within a tolerance of about ±15 percent, in some embodiments ±10 percent, in further embodiments ±8% and in other embodiments ±6%. The tolerance can be expressed in terms of absolute water quantities as ±50 ppm, in further embodiments ±40 ppm and in other embodiments ±25 ppm, although for larger selected water contents, the absolute tolerance may be larger from a practical perspective. In terms of absolute values of solvent water content, the solvent can be adjusted to have a water content from about 250 ppm by weight to about 10,000 ppm by weight, in further embodiments from about 275 ppm by weight to about 6000 ppm by weight, in other embodiments from about 300 ppm by weight to about 5000 ppm by weight, and in some embodiments from about 300 ppm by weight to about 4000 ppm by weight and in additional embodiments from about 300 ppm by weight to about 2500 ppm by weight. A suitable water content may be somewhat dependent on the tin concentration in an adjusted precursor solution, so that a 0.5M tin solution may be stable with a larger water content than a 0.05M tin concentration in an adjusted precursor solution. The solutions with adjusted water contents can have or be designed to have a stability as described in the previous paragraph. A person of ordinary skill in the art will recognize that additional ranges of water tolerance or water content within the values given above are contemplated and are within the present disclosure.

The adjusted solutions with the selected water content within a specified tolerance should then be stored in a sealed container or other circumstances to avoid exposure to ambient air that can alter the water content. With sufficient stabilization, the containers of monoalkyl tin trialkoxides can be distributed in the containers to locations for the performance of lithographic patterning.

As noted above, the monoalkyl trialkoxide solutions are used to form a hydrated coating of monoalkyl tin ox hydroxo composition. The further hydrolysis to form this composition can be performed during deposition through exposure to atmospheric water of through the delivery of some water vapor or following deposition through the addition of a sufficient amount of water. The hydrolyzed coating can be subjected to a drying step that can involve heating of the coating. Radiation, electromagnetic or electron beam, generally can be directed to the dried coated substrate through a mask or a radiation beam can be controllably scanned across the substrate to form a latent image in the coating. Various additional processing steps, such as heating steps and development, can be performed to pattern the coating in either a positive tone or negative tone image. These organometallic patterning compositions provide especially promising properties for the advance of EUV patterning into the formation of finer patterning features.

For the formation of thin coatings on wafers, the precursor solutions with added water have been found to form more uniform coatings when applied by spin coating onto a wafer. If patterning is performed using radiation, spin coating can be a desirable approach to cover the substrate relatively uniformly, although there can be edge effects. In some embodiments, a wafer can be spun at rates from about 500 rpm to about 10,000 rpm, in further embodiments from about 1000 rpm to about 7500 rpm and in additional embodiments from about 2000 rpm to about 6000 rpm. The spinning speed can be adjusted to obtain a desired coating thickness. The spin coating can be performed for times from about 5 seconds to about 5 minutes and in further embodiments from about 15 seconds to about 2 minutes. An initial low speed spin, e.g. at 50 rpm to 250 rpm, can be used to perform an initial bulk spreading of the composition across the substrate. A back side rinse, edge bead removal step or the like can be performed with water or other suitable solvent to remove any edge bead. A person or ordinary skill in the art will recognize that additional ranges of spin coating parameters within the explicit ranges above are contemplated and are within the present disclosure.

The thickness of the coating generally can be a function of the precursor solution concentration, viscosity and the spin speed for spin coating. For other coating processes, the thickness can generally also be adjusted through the selection of the coating parameters. In some embodiments, it can be desirable to use a thin coating to facilitate formation of small and highly resolved features in the subsequent patterning process. For example, the coating materials after drying can have an average thickness of more than about 250 nanometers (nm), in additional embodiments from about 1 nanometers (nm) to about 50 nm, in other embodiments from about 2 nm to about 40 nm and in further embodiments from about 3 nm to about 25 nm. A person of ordinary skill in the art will recognize that additional ranges of thicknesses within the explicit ranges above are contemplated and are within the present disclosure. The thickness can be evaluated using non-contact methods of x-ray reflectivity and/or ellipsometry based on the optical properties of the film. In general, the coatings are relatively uniform to facilitate processing. In some embodiments, such as high uniformity coatings on reasonably sized substrates, the evaluation of coating uniformity or flatness may be evaluated with a 1 centimeter edge exclusion, i.e., the coating uniformity is not evaluated for portions of the coating within 1 centimeter of the edge, although other suitable edge exclusions can be selected. The stable precursor solutions with added water can be evaluated for coating flatness across a substrate to obtain the standard deviation of coating thickness. In the Examples below, a value of 3 sigma is reported, which is three times the standard deviation across the wafer surface. For the stabile precursor solutions with added water, the 3 sigma values can be on average no more than about 1.2 nanometers (nm), in further embodiments no more than about 1.1 nm, and in other embodiments no more than about 1.05 nm. A person of ordinary skill in the art will recognize that additional ranges within the explicit ranges of thickness and flatness above are contemplated and are within the present disclosure.

EXAMPLES

Example 1—Measurement of Solvent Water Content

This example provides measurements of the water content of commercial alcohol samples. The alcohol was a semiconductor grade 4-methyl-2-pentanol with a purity level reported as 99.9% pure.

To measure the water content, a commercial Karl Fischer Titrator was used. Karl Fischer titration uses a reaction with trace water to provide very accurate measurements of residual water in a short period of time. The measurements with these instruments are generally accurate to ±5 ppm, and water adjustment can be made to this level of accuracy. Batch variation of water content was determined for twelve representative samples of semiconductor grade commercial 4-methyl-2-pentanol (4M2P). A range of water content across 12 different lots of 4M2P alcohol was found to vary from 41 ppm to 166 ppm as shown in Table 1 below.

TABLE 1

Unadjusted Solvent Water Content

| Lot # | ppm $H_2O$ |
| --- | --- |
| 1 | 41 |
| 2 | 88 |
| 3 | 120 |
| 4 | 166 |
| 5 | 134 |
| 6 | 82 |
| 7 | 81 |
| 8 | 106 |
| 9 | 96 |
| 11 | 90 |
| 11 | 112 |
| 12 | 78 |

Example 2—Solution Preparation

A series of twelve solutions were prepared. Three solutions contained a single monoalkyl tin trialkoxide, and the remaining 9 solutions comprised blends of the three tin compounds. The desired solutions are generally formed from $RSn(Ot-Amyl)_3$ (Ot-Amyl=2-methylbutan-2-oxide) precursors synthesized according to methods described in the '286' patent application or alcoholysis of the chlorides $RSnCl_3$. A single precursor or a binary mixture of precursors is dissolved in 4-methyl-2-pentanol containing prescribed concentrations of water.

Three different monoalkyl tin tri(Ot-amyl) compounds were prepared from corresponding monoalkyl tin trimethylamides through a reaction with 2-methyl-2-butanol. The monoalkyl tin trimethylamides were formed with the reaction of a Grignard reagent ($CH_3MgCl$, $(CH_3)_2CHMgCl$ or $(CH_3)_3CMgCl$) with tin tetramethylamine ($Sn(NHCH_3)_4$) to form respectively, $MeSn(Ot-amyl)_3$, $i-PrSn(Ot-amyl)_3$, or $t-Bu\ MeSn(Ot-amyl)_3$. The synthesis of the trialkoxide compounds from the trimethylamide compounds is described further in the '286 application cited above. These three tin compounds were then used to form the twelve solutions. Three solutions simply involved the dilution of the purified compounds in the 4-methyl-2-pentanol to obtain a tin concentration of 0.05M. To simplify the following discussion, the three solutions are labeled X for the solution with $t-BuSn(Ot-amyl)_3$ compound, Y representing the $MeSn(Ot-amyl)_3$ compound and Z representing the $i-PrSn(Ot-amyl)_3$ compound.

The formation of the blends is described next. The binary mixtures are described by each alkyl component and the mole percentage of the second component relative to the total moles Sn in each solution. For example, XY20 corresponds to a solution of 80 mole % $t-BuSn(Ot-Amyl)_3$ and 20 mole % $MeSn(Ot-Amyl)_3$; ZY75 corresponds to a solution of 25 mole % $i-PrSn(Ot-Amyl)_3$ and 75 mole % $MeSn(Ot-Amyl)_3$.

Preparation and Compositions of t-Bu/Me Series

Three solutions were prepared with blends of t-BuSn(Ot-amyl)$_3$ with MeSn(Ot-amyl)$_3$. These solutions are referenced as XY solutions based on the notation of the single compound solutions above. To prepare 100 mL 0.05 M [Sn] of solution denoted XY20, 1.619 mL of t-BuSn(Ot-Amyl)$_3$ (ρ=1.08 g/cm$^3$) and 0.356 mL of MeSn(OtAmyl)$_3$ (ρ=1.11 g/cm3) were mixed in a glove box. 4-methyl-2-pentanol with selected H$_2$O concentrations were then cannulated to the premixed precursors on a Schlenk line to a final [Sn] of 0.05 M. The XY20 notation indicates 20 mole percent of the Y component, i.e., the MeSn(Ot-amyl)$_3$ with 80 mole percent then of the t-butyl compound. Similarly, XY35 and XY50 blends were prepared with 35 mole percent methyl compound and 50 mole percent methyl compound, respectively.

Preparation and Compositions of t-Bu/i-Pr Series

Three solutions were prepared with blends of t-BuSn(Ot-amyl)$_3$ with i-PrSn(Ot-amyl)$_3$. To prepare 100 mL 0.05 M [Sn] of a solution denoted XZ75, 0.506 ml of t-BuSn(Ot-Amyl)$_3$ and 1.443 mL of i-PrSn(Ot-Amyl)$_3$ (ρ=1.10 g/cm3) were mixed in a glove box. 4-methyl-2-pentanol with selected H$_2$O concentrations were then cannulated to the premixed precursors on a Schlenk line to a final [Sn] of 0.05 M. The XZ75 notation indicates 75 mole percent of the Z component, i.e., i-PrSn(Ot-amyl)$_3$ with 25 mole percent then of the t-butyl compound. Similarly, XZ40 and XZ25 blends were prepared with 40 mole percent iso-propyl compound and 25 mole percent iso-propyl compound, respectively.

Preparation and Compositions of i-Pr/Me Series

Three solutions were prepared with blends of i-PrSn(Ot-amyl)$_3$ with MeSn(Ot-amyl)$_3$. To prepare 100 mL 0.05 M [Sn] of a solution denoted ZY50, 0.962 mL of i-PrSn(Ot-Amyl)$_3$ and 0.890 mL of MeSn(Ot-Amyl)$_3$ were mixed in a glove box. 4-methyl-2-pentanol with selected H$_2$O concentrations were then cannulated to the premixed precursors on a Schlenk line to a final [Sn] of 0.05 M. The ZY50 notation indicates 50 mole percent of the Y component, i.e., the MeSn(Ot-amyl)$_3$ with 50 mole percent then of the iso-propyl compound. Similarly, ZY25 and ZY75 blends were prepared with 25 mole percent methyl compound and 75 mole percent methyl compound, respectively.

Example 3—Solution Stabilities and Results

Table 2 summarizes stability results for the twelve solutions noted above involving dissolution of a single alkyl species and binary mixtures of RSn(Ot-Amyl)$_3$ with the alkyl groups R=t-butyl (X), methyl (Y), and i-Pr (Z). The water content of the 4-methyl-2-pentanol (4M2P) solvent is indicated in second row and the five middle columns of the table. The water content is adjusted by measuring the water content of a sample of the 4M2P solvent and adding deionized water to obtain the desired adjusted water amount. As noted above, the various species interact in solution, so that the reference to the species added into the solution can be more readily evaluated than the complex species formed in mixtures.

Solution stability was determined by visual observation of a precipitate in the solution. The precipitate is easily observed to form from one 24-hour period to the next.

Table 2 summarizes times to precipitation. Specifically, Table 2 shows solution stability data for RSn(Ot-Am)$_3$ and mixtures thereof in 4-methyl-2-pentanol (4M2P) with a prescribed water content. Dashed marks "-" represents solutions that remain clear without precipitation for the duration of the corresponding observational period, a period that is at least 148 days (21 weeks), and "nt" represents conditions that were not tested. The observational periods for each solution are presented in Table 2. Single specie solutions X and Y precipitate immediately in water-rich (5000 ppm H$_2$O) 4M2P. Single specie solution Z remains clear and stable at all water loadings for at least 178 days. XY solutions significantly extend the stability times of solutions containing X. XYn solutions with n of about 35 and higher are stable for at least 8 months against 2000 ppm water, and XY50 solutions are stable for at least 8 months against 5000 ppm water. ZY solutions effectively maintain the stability of Z solutions and extend the stability of Y solutions, except for high loadings of Y and H$_2$O (Y about 75% and higher with >4000 ppm H$_2$O), which lead to precipitation in 1 day. Stable ZY solutions have been shown to be stable for at least 161 days. XZ solutions effectively enhance the stability of solutions containing X; measured stabilities extend to 8 months. It should be noted that 8 months was the length of the observational period for XZ solutions, and select compositions are thought to be stable for significantly longer periods of time.

TABLE 2

| Alkyl (R) | 4M2P Adjusted Water Content (ppm) | | | | | Observation Time (days) |
|---|---|---|---|---|---|---|
| | 300 | 1000 | 2000 | 4000 | 5000 | |
| (X) | 28 days | 2 days | nt | nt | immediately | 236 |
| (Y) | — | — | 2 days | nt | immediately | 233 |
| (Z) | — | — | — | — | nt | 178 |
| XY20 | — | — | 8 days | nt | 1 day | 236 |
| XY35 | — | — | 184 days | 93 days | nt | 184 |
| XY50 | — | — | — | nt | — | 236 |
| ZY25 | — | — | — | — | nt | 161 |
| ZY50 | — | — | — | — | nt | 161 |
| ZY75 | — | — | — | 1 hr | nt | 161 |
| XZ25 | — | — | 28 days | 3 days | nt | 148 |
| XZ40 | — | — | — | 13 days | nt | 148 |
| XZ75 | — | — | — | 148 days | nt | 148 |

Example 4—Coating Uniformity

Table 3A and Table 3B summarize the thicknesses of film coatings made from a series of XY20 samples deposited onto 300 mm Si wafers. Film thicknesses were measured on an Aleris Ellipsometer manufactured by KLA Tencor by measuring 29 points across the wafer, and the corresponding summarized data for each sample is presented in Table 3A and Table 3B.

Two types of samples were analyzed and are represented by sample labels A or B, wherein A represents a composition of XY20 without additional water added to the formulation solvent and B represents a composition of XY20 with the formulation solvent having an adjusted water content of 300 ppm±10 ppm. For each sample type 7 different wafers were coated and analyzed.

TABLE 3A

| Sample # | Mean Film Thickness (nm) | 3σ Thickness (nm) |
|---|---|---|
| A1 | 22.3 | 1.74 |
| A2 | 22.3 | 1.44 |
| A3 | 22.9 | 1.44 |
| A4 | 22.9 | 1.35 |
| A5 | 23.1 | 1.37 |
| A6 | 22.6 | 1.23 |
| A7 | 20.5 | 1.86 |
| Average: | 22.4 | 1.49 |

TABLE 3B

| Sample # | Mean Film Thickness (nm) | 3σ Thickness (nm) |
|---|---|---|
| B1 | 22.6 | 1.32 |
| B2 | 22.6 | 0.82 |
| B3 | 23.2 | 0.90 |
| B4 | 23.3 | 1.22 |
| B5 | 23.4 | 1.03 |
| B6 | 22.5 | 0.62 |
| B7 | 21.3 | 1.25 |
| Average: | 22.7 | 1.02 |

In the tables above, 3sigma thickness values (i.e., standard deviation multiplied by 3) are presented to represent a measure of variability across the wafer. As evidenced by the significantly lower 3 sigma values for sample types B, a more consistent coating uniformity can be achieved for compositions that have been prepared from solvents having a normalized water level.

The embodiments above are intended to be illustrative and not limiting. Additional embodiments are within the claims. In addition, although the present invention has been described with reference to particular embodiments, those skilled in the art will recognize that changes can be made in form and detail without departing from the spirit and scope of the invention. Any incorporation by reference of documents above is limited such that no subject matter is incorporated that is contrary to the explicit disclosure herein. To the extent that specific structures, compositions and/or processes are described herein with components, elements, ingredients or other partitions, it is to be understand that the disclosure herein covers the specific embodiments, embodiments comprising the specific components, elements, ingredients, other partitions or combinations thereof as well as embodiments consisting essentially of such specific components, ingredients or other partitions or combinations thereof that can include additional features that do not change the fundamental nature of the subject matter, as suggested in the discussion, unless otherwise specifically indicated.

What is claimed is:

1. A plurality of coated substrates each comprising a substrate and a dry coating comprising an organometallic patterning composition having an average thickness from about 6 nanometers (nm) to about 50 nm, wherein the plurality of coated substrates has an average three sigma variation in dry coating thickness of no more than about 1.2 nm with a one centimeter edge exclusion.

2. The plurality of coated substrates of claim 1 wherein the substrate is a wafer comprising silicon.

3. The plurality of coated substrates of claim 1 wherein the dry coating comprises tin.

4. The plurality of coated substrates of claim 3 wherein the dry coating comprises tin oxo hydroxo composition with tin carbon bonds.

5. The plurality of coated substrates of claim 1 wherein the average thickness is from 3 nm to about 25 nm and the average three sigma variation in dry coating thickness is not more than about 1.1 nm.

6. The plurality of coated substrates of claim 1 wherein the coating is formed using spin coating of a solution and drying.

7. The plurality of coated substrates of claim 6 wherein the solution comprises a mixture of alcohol with a selected water content and a first monoalkyl tin trialkoxide (RSn(OR')$_3$), wherein the solution has a tin concentration from about 0.004 M to about 1.0 M and wherein the selected water content is at least about 250 pm by weight and wherein the solution is stable for at least 42 days.

8. The plurality of coated substrates of claim 7 wherein R and R' are independently hydrocarbyl groups having from 1-31 carbon atoms with one or more carbon atoms optionally substituted with one of more heteroatom functional groups containing O, N, Si, Ge, Sn, Te, halogen atoms, or a combination thereof.

9. The plurality of coated substrates of claim 7 wherein R comprises a hydrocarbyl group substituted with a cyano group, a thio group, a silyl group, an ether group, a keto group, an ester group, a phenyl group, a halogenated group, or a combination thereof.

10. The plurality of coated substrates of claim 7 wherein R comprises a branched alkyl, a cyclo-alkyl, or an alkynyl and R' comprises methyl, ethyl, propyl, isopropyl, butyl, t-butyl, isobutyl, or t-amyl.

11. The plurality of coated substrates of claim 7 wherein the solution is stable for at least 6 months.

12. A method for patterning a radiation sensitive coating, the method comprising:
forming a coating on a substrate surface with an organotin precursor solution wherein the organotin precursor solution has a uniform composition resulting from adjusting the water content of the solvent used to form the organotin precursor solution within about ±15% of a selected water content, wherein the selected water content is from about 250 ppm by weight to about 10,000 ppm by weight, and wherein the organotin precursor solution comprises a mixture of alcohol with the selected water content and a first monoalkyl tin trialkoxide (RSn(OR')$_3$), wherein R and R' are independently hydrocarbyl groups having from 1-31carbon atoms with one or more carbon atoms optionally substituted with one of more heteroatom functional groups, wherein the organotin precursor solution has a tin concentration from about 0.004M to about 1.0M;
drying the coating; and
irradiating the dried coating to form a latent image.

13. The method of claim 12 wherein irradiation is performed with EUV radiation.

14. The method of claim 12 wherein forming a coating comprises spin coating.

15. The method of claim 14 wherein the spin coating is performed at 1000 rpm to 7500 rpm after an initial low speed spin.

16. The method of claim 14 wherein a backside rinse and bead edge rinse are performed after completing the spin coating.

17. The method of claim 12 wherein R comprises t-butyl and/or R' comprises (Ot-amyl)$_3$.

18. The method of claim 12 wherein the precursor solution further comprises as an ingredient a second monoalkyl tin trialkoxide distinct from the first monoalkyl tin trialkoxide.

* * * * *